United States Patent
Lin et al.

(10) Patent No.: US 10,154,613 B1
(45) Date of Patent: Dec. 11, 2018

(54) ELECTRONIC DEVICE AND HEAT DISSIPATION STRUCTURE THEREOF

(71) Applicant: CHAUN-CHOUNG TECHNOLOGY CORP., New Taipei (TW)

(72) Inventors: I-Yung Lin, New Taipei (TW);
Po-Chih Liu, New Taipei (TW);
Wen-Tang Chen, New Taipei (TW)

(73) Assignee: CHAUN-CHOUNG TECHNOLOGY CORP., New Taipei (TW)

( * ) Notice: Subject to any disclaimer, the term of this patent is extended or adjusted under 35 U.S.C. 154(b) by 0 days.

(21) Appl. No.: 15/908,675

(22) Filed: Feb. 28, 2018

(51) Int. Cl.
*H05K 7/00* (2006.01)
*H05K 7/20* (2006.01)
*G06F 1/16* (2006.01)
*G06F 1/20* (2006.01)

(52) U.S. Cl.
CPC ......... *H05K 7/2039* (2013.01); *G06F 1/1616* (2013.01); *G06F 1/203* (2013.01)

(58) Field of Classification Search
CPC .................................................. G06F 1/1616
See application file for complete search history.

(56) References Cited

U.S. PATENT DOCUMENTS 5,832,987 A * 11/1998 Lowry .................... F28F 13/00
165/86

* cited by examiner

*Primary Examiner* — Jerry Wu

(74) *Attorney, Agent, or Firm* — Chun-Ming Shih; HDLS IPR Services

(57) ABSTRACT

An electronic device and a heat dissipation structure thereof are provided. The electronic device comprises a first shell body; a second shell body, mutually pivoted with the first shell body; and a heat dissipation structure, including a first heat conducting member and a second heat conducting member, wherein the first heat conducting member is disposed in the first shell body and extended with a first arc-shaped piece, the second heat conducting member is disposed in the second shell body and extended with a second arc-shaped piece, and the second arc-shaped piece is arranged to be thermally in contact with the first arc-shaped piece and capable of sliding and rotating relative to the first arc-shaped piece. Accordingly, thermal energy can be transferred from the shell body having a heat unit to the other shell body, thereby increasing the heat dissipation efficiency of the electronic device.

8 Claims, 9 Drawing Sheets

ELECTRONIC DEVICE AND HEAT DISSIPATION STRUCTURE THEREOF

BACKGROUND OF THE INVENTION

Field of the Invention

The present invention relates to a heat dissipation structure, especially to an electronic device and a heat dissipation structure thereof.

Description of Related Art

The technology of developing electronic components has been being advanced, especially for a central process unit adopted in a computer, with the advanced technology, the volume thereof can be much smaller, and the operating performance and efficiency can be much greater; however, the thermal energy generated due to the power consumption while being operated is inevitably increased, if the thermal energy of the central process unit cannot be dissipated, the computer may be in an crashing status or the central process unit may even be burned and damaged.

A conventional heat dissipation structure is to dispose a heat spreader or a heat pipe in the same shell body where the central process unit is disposed, the heat spreader or the heat pipe is arranged to be in contact with the central process unit, so that the thermal energy of the central process unit can be transferred to a lateral side of a mainframe via the heat spreader or the heat pipe, thereby allowing the thermal energy to be dissipated to the atmosphere, but in a modern mainframe where the central process unit is disposed, the interior thereof is also disposed with internal components or other electronic components with a compactly arranging means, thus the thermal energy in the mainframe is unable to be effectively dissipated.

Accordingly, the applicant of the present invention has devoted himself for improving the mentioned disadvantages.

SUMMARY OF THE INVENTION

The present invention is to provide an electronic device and a heat dissipation structure thereof, in which when a heating unit is arranged to be thermally in contact with a first heat conducting member, thermal energy is transferred to a second heat conducting member via a first arc-shaped piece and a second arc-shaped piece; when the heating unit is arranged to be thermally in contact with the second heat conducting member, the thermal energy is transferred to the first heat conducting member via the first arc-shaped piece and the second arc-shaped piece, so that an effect of allowing the thermal energy to be transferred from the shell body having the heat unit to the other shell body can be achieved, thereby increasing the heat dissipation efficiency of the electronic device.

Accordingly, the present invention provides an electronic device, which comprises: a first shell body; a second shell body, mutually pivoted with the first shell body; and a heat dissipation structure, including a first heat conducting member and a second heat conducting member, wherein the first heat conducting member is disposed in the first shell body and extended with a first arc-shaped piece, the second heat conducting member is disposed in the second shell body and extended with a second arc-shaped piece, and the second arc-shaped piece is arranged to be thermally in contact with the first arc-shaped piece and capable of sliding and rotating relative to the first arc-shaped piece.

Accordingly, the present invention provides a heat dissipation structure, which includes: a first heat conducting member, extended with a first arc-shaped piece; and a second heat conducting member, extended with a second arc-shaped piece, wherein the second arc-shaped piece is arranged to be thermally in contact with the first arc-shaped piece and capable of sliding and rotating relative to the first arc-shaped piece.

According to the present invention, the heat dissipation structure further includes two heat conducting flexible pieces, one of the heat conducting flexible pieces is arranged to be in contact with an outer surface of the first arc-shaped piece and capable of being displaced with the first arc-shaped piece, the other heat conducting flexible piece is arranged to be in contact with an inner surface of the second arc-shaped piece and capable of being displaced with the second arc-shaped piece; during the process of the first shell body and the second shell body being relatively folded or unfolded, a friction force generated while the first arc-shaped piece and the second arc-shaped piece being relatively sliding can be damped by the heat conducting flexible pieces, so that the friction between the first arc-shaped piece and the second arc-shaped piece can be prevented, and damages and noises generated due to the friction can be avoided.

According to the present invention, the electronic device further comprises an elastic member, because during the process of the first shell body and the second shell body being mutually folded or unfolded, the contacting status of the first arc-shaped piece and the second arc-shaped piece may be loosened, the elastic member is clamped between the second arc-shaped piece and the second shell body, so that the elastic member is able to press the second arc-shaped piece to be leaned against the first arc-shaped piece; thus during the process of the first shell body and the second shell body being mutually folded or unfolded, the first arc-shaped piece, the second arc-shaped piece and the two heat conducting flexible pieces can be remained in a mutually-contacting status, and the heat conduction between the first arc-shaped piece, the second arc-shaped piece and the heat conducting flexible pieces can be further enhanced.

DETAILED DESCRIPTION OF THE INVENTION

A preferred embodiment of the present invention will be described with reference to the drawings.

Figure 1:
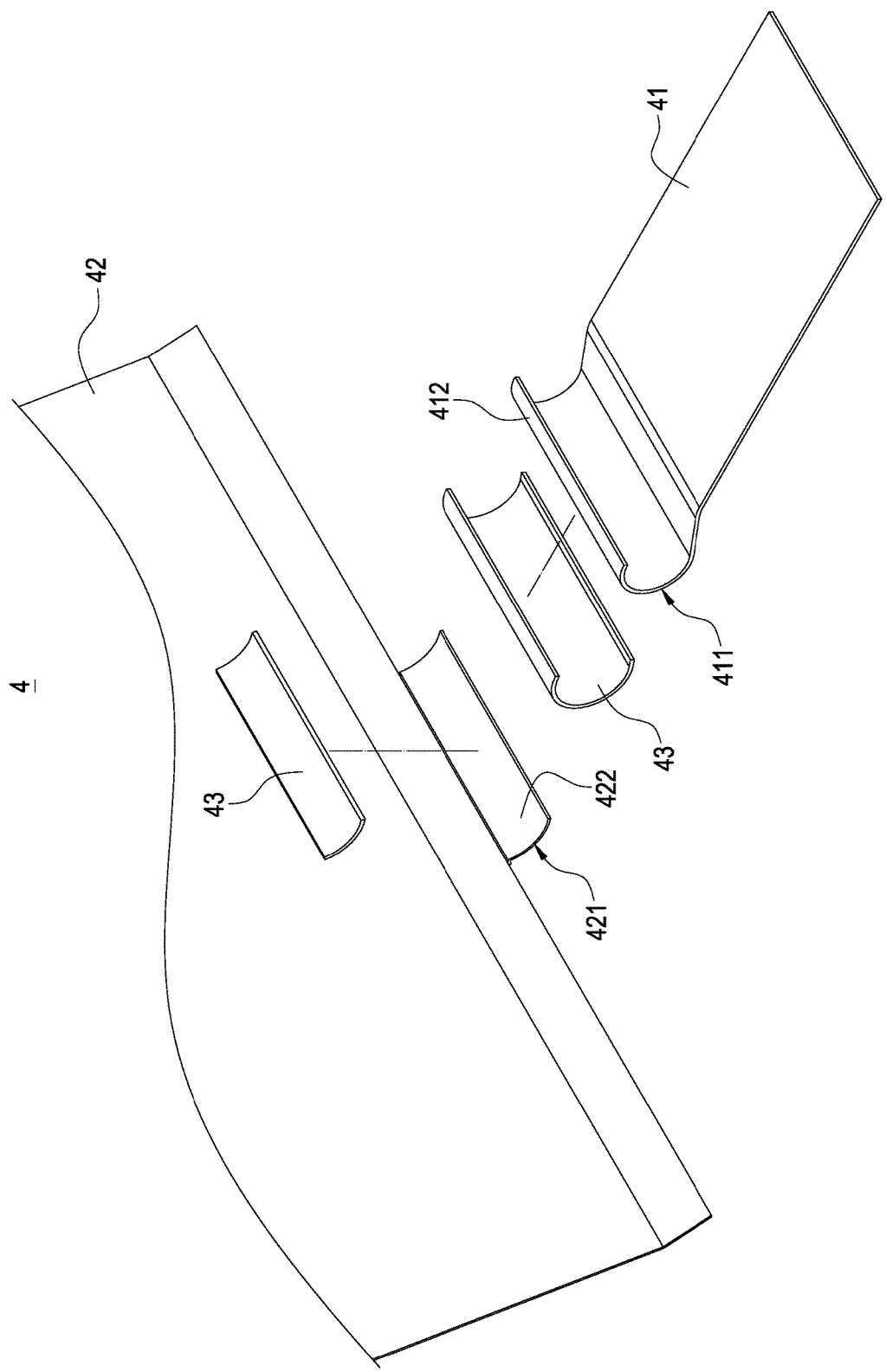
FIG. 1 is a perspective exploded view showing a heat dissipation structure according to the present invention.
Figure 2:
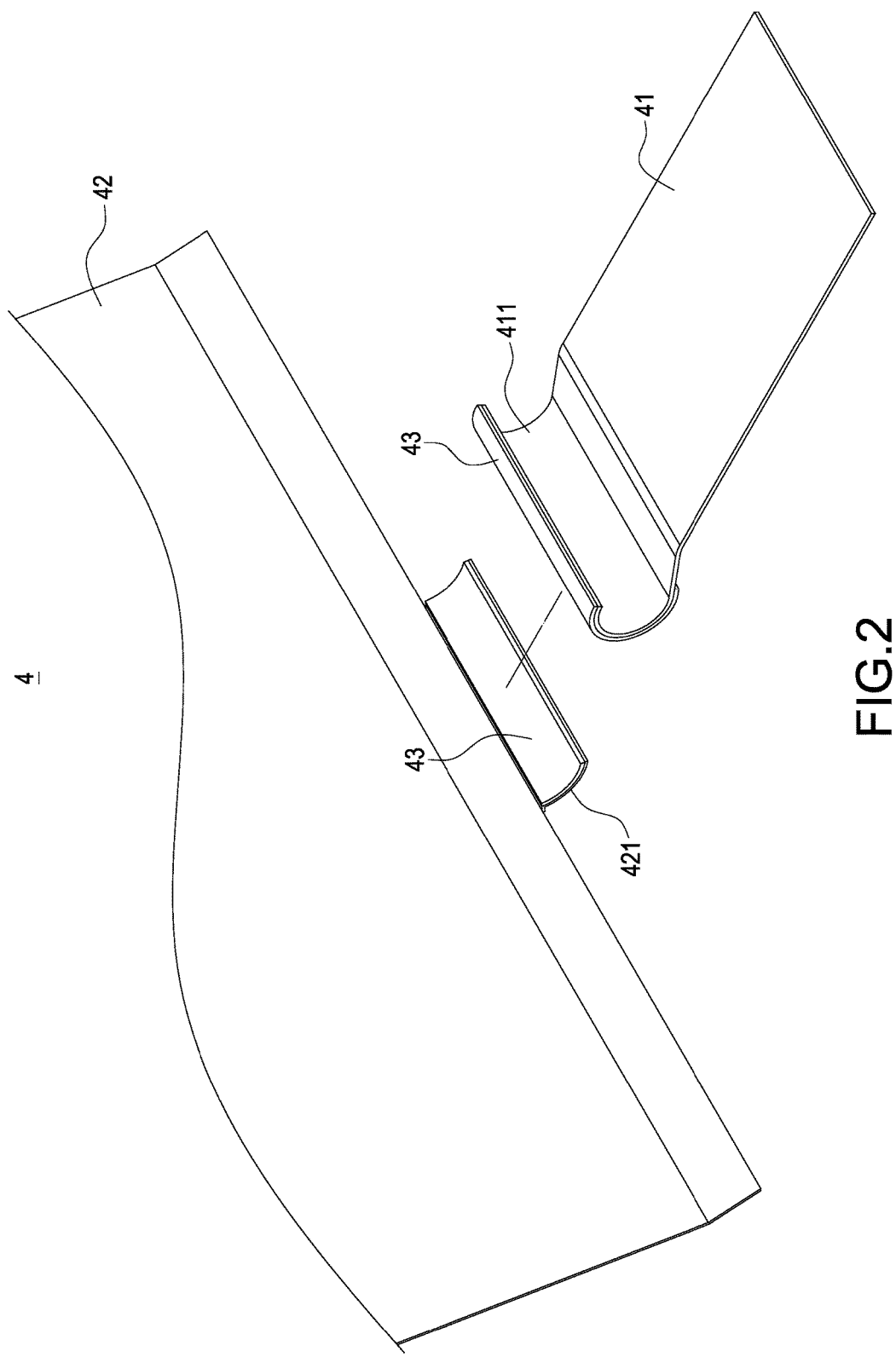
FIG. 2 is another perspective exploded view showing the heat dissipation structure according to the present invention.
Figure 3:
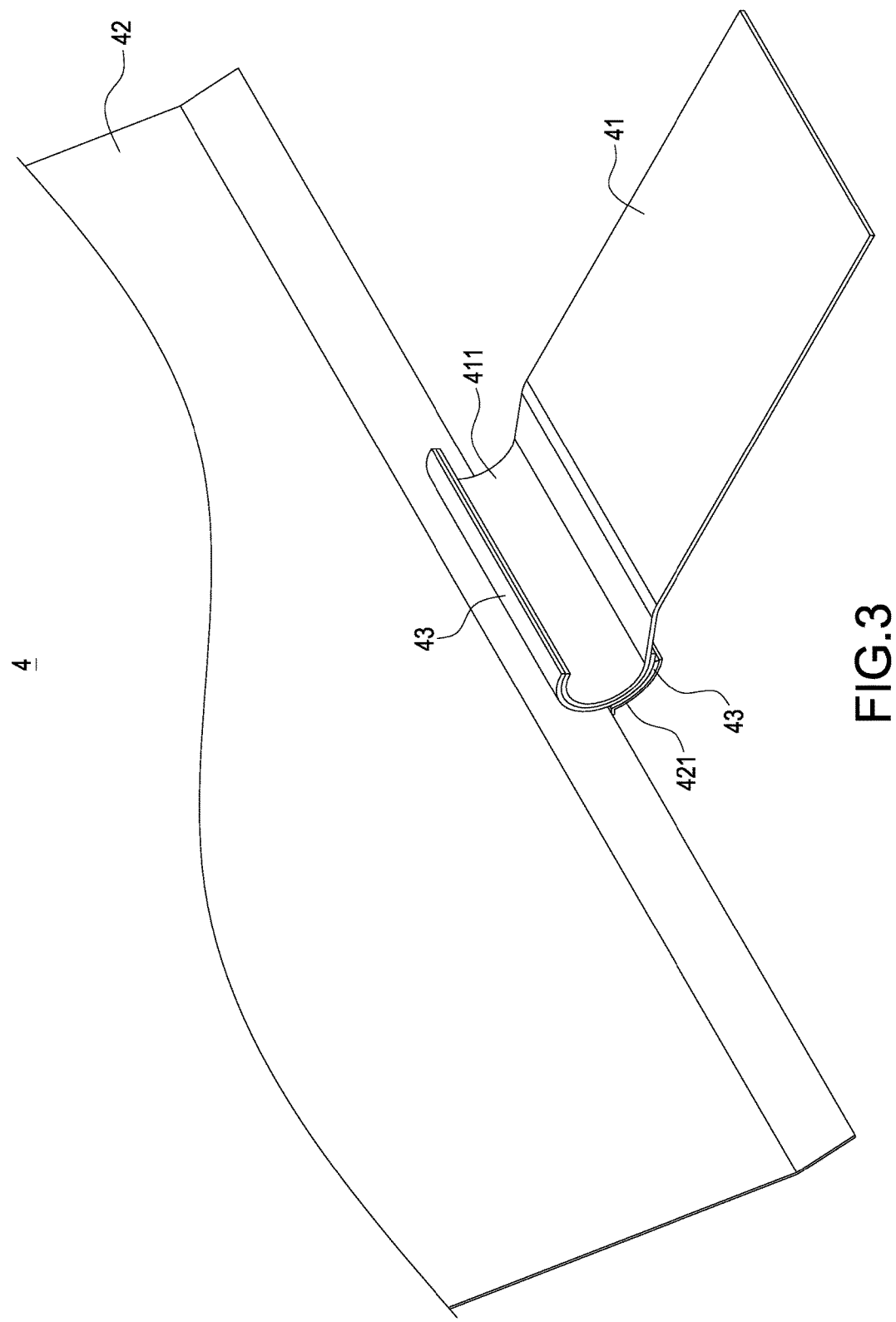
FIG. 3 is a perspective view showing the assembly of the heat dissipation structure according to the present invention.
Figure 4:
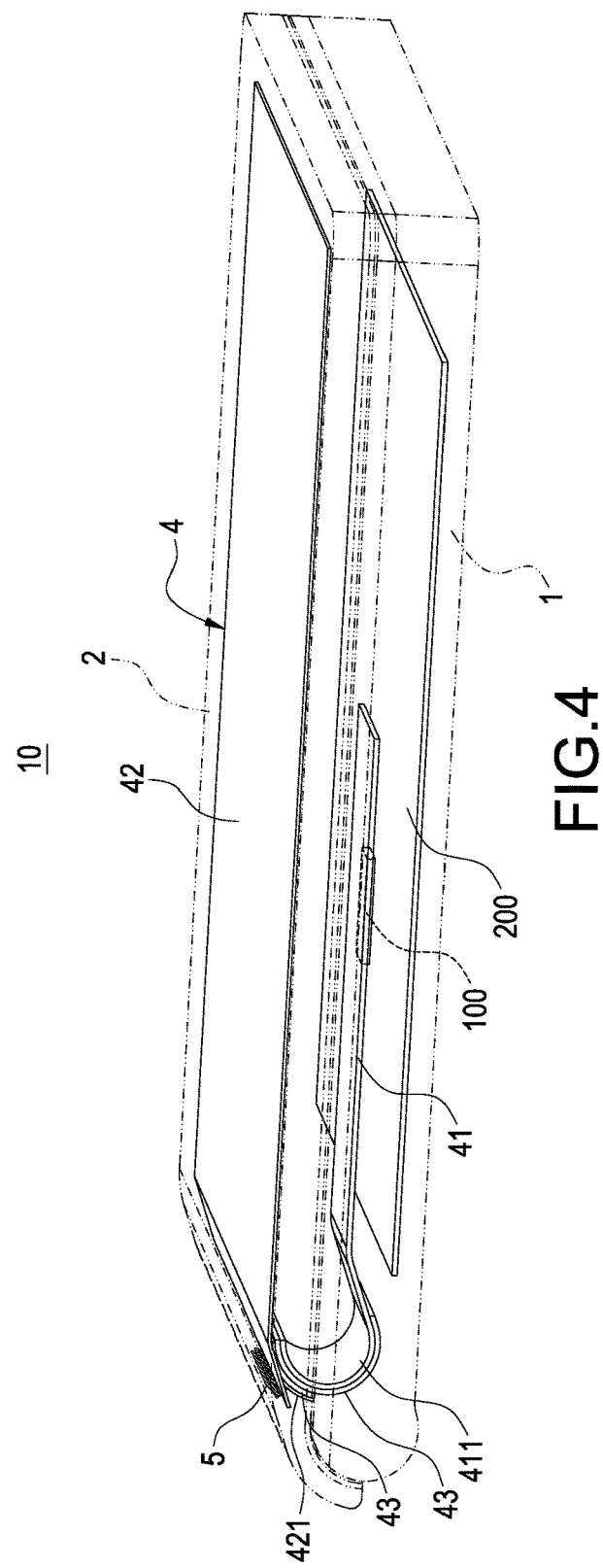
FIG. 4 is a schematic view showing an operating status of an electronic device according to the present invention.
Figure 5:
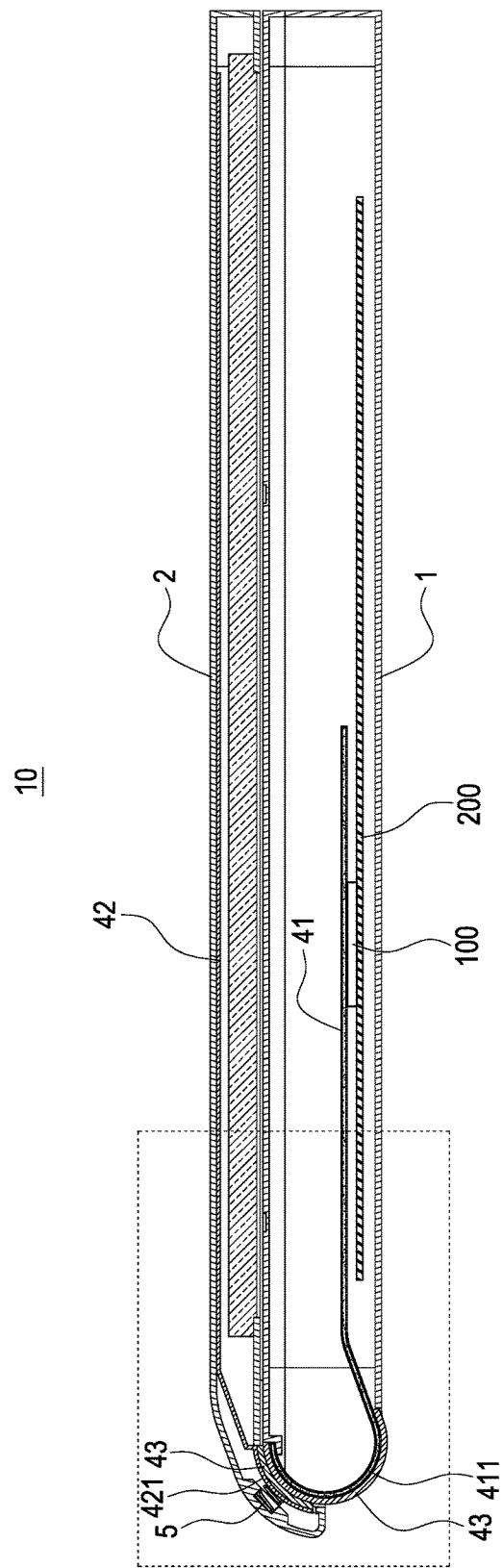
FIG. 5 is a cross sectional view showing the electronic device according to the present invention.
Figure 6:
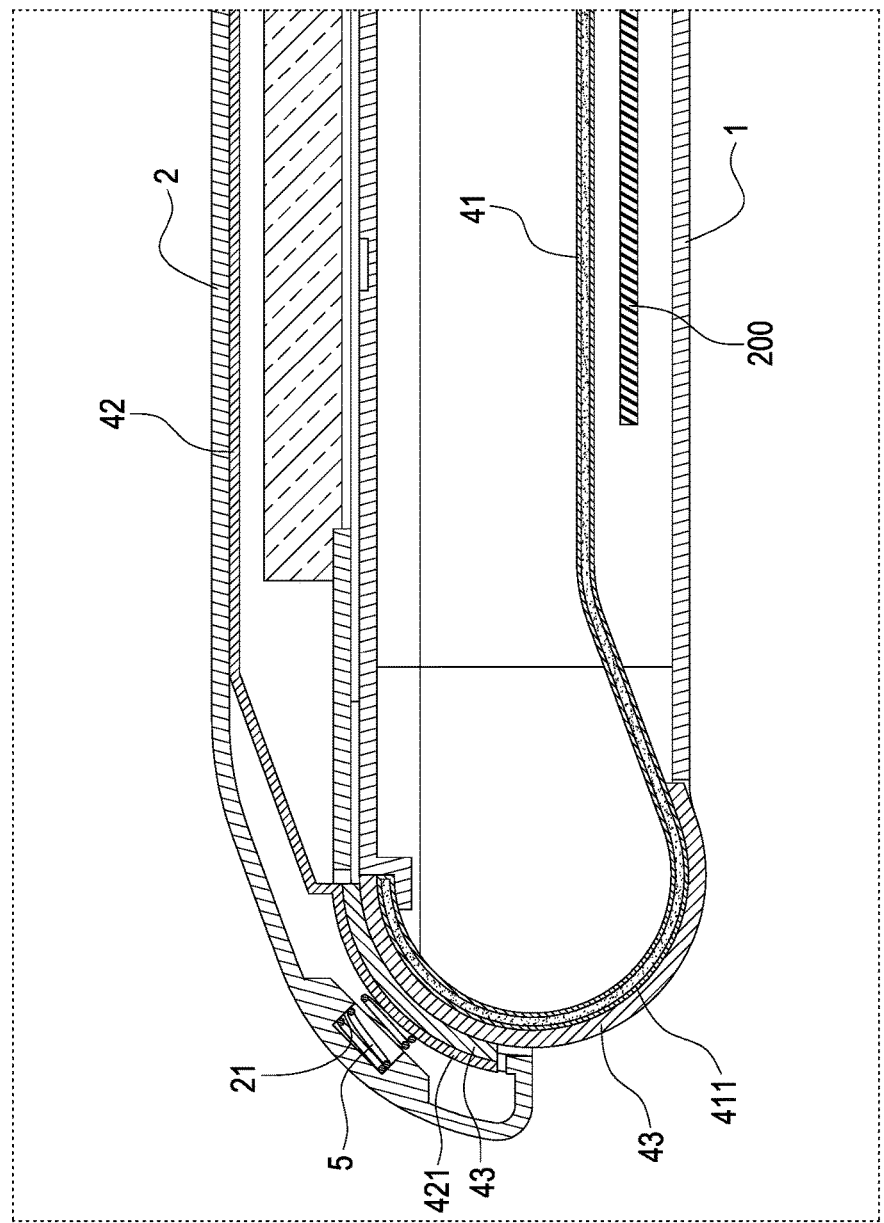
FIG. 6 is a partially enlarged view showing the electronic device according to the present invention.
Figure 7:
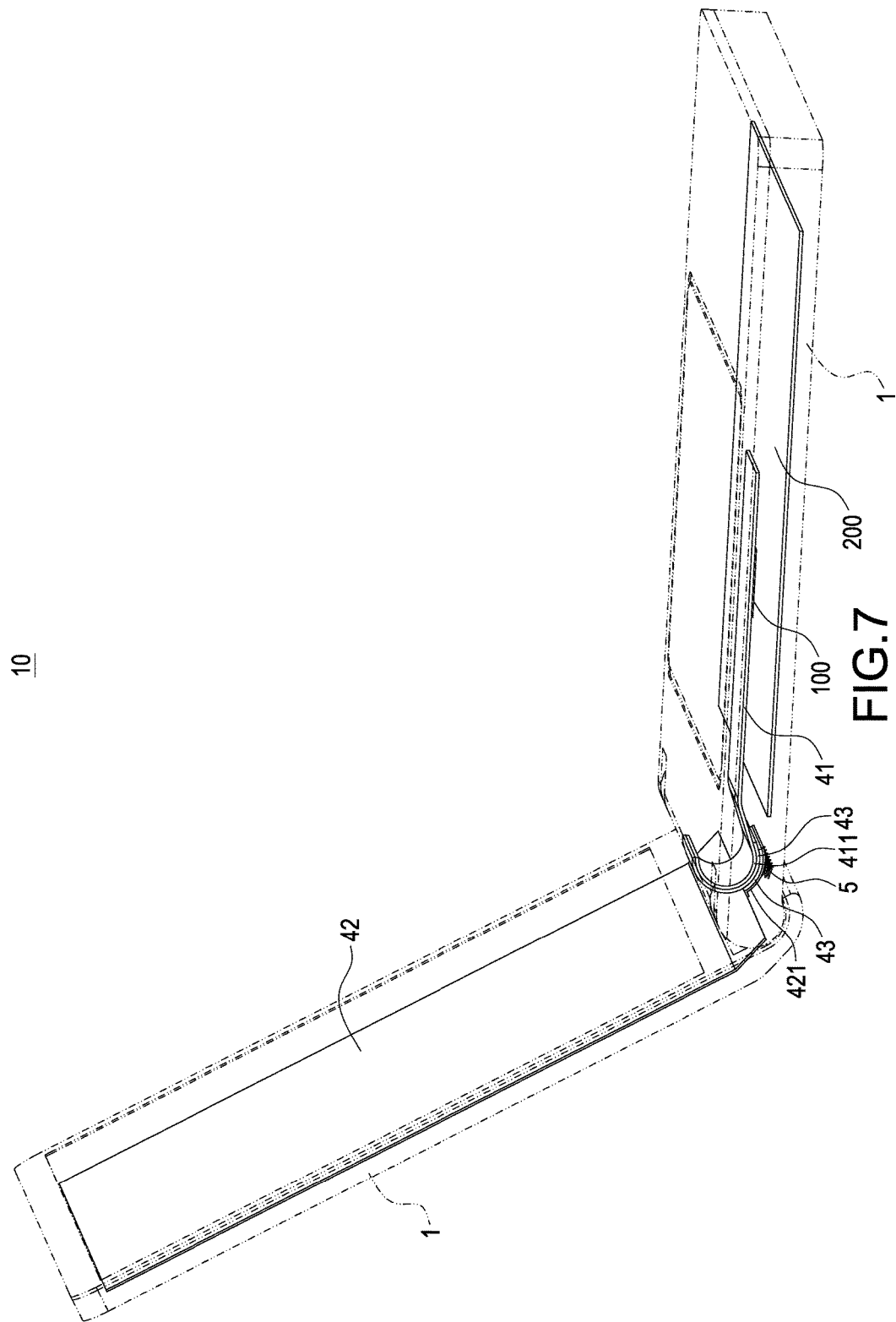
FIG. 7 is a schematic view showing another operating status of the electronic device according to the present invention.
Figure 8:
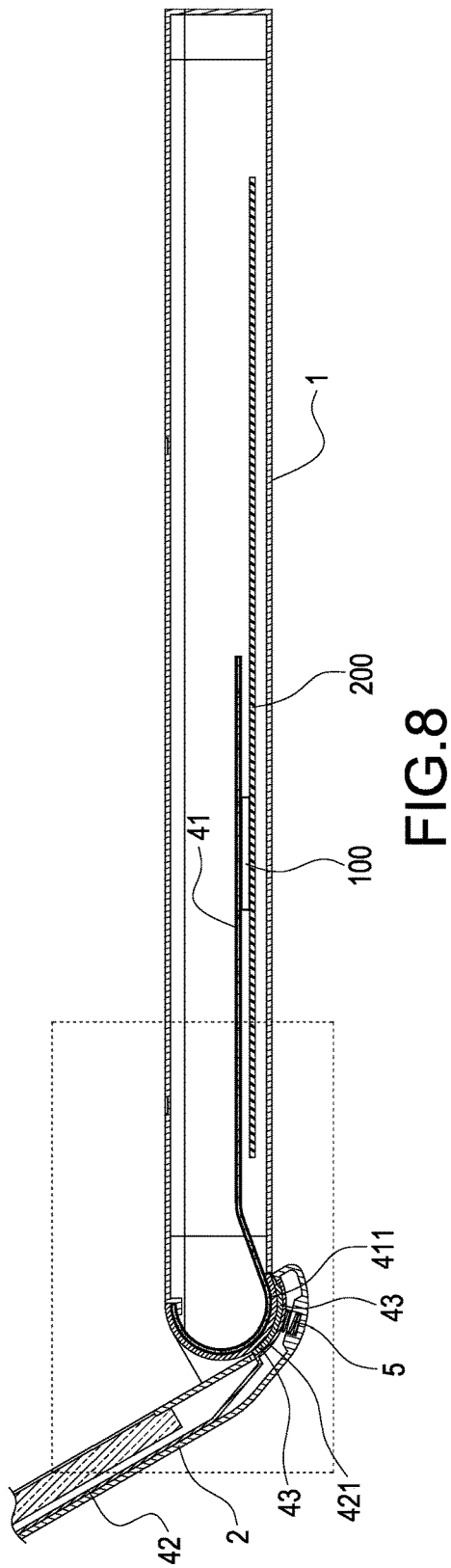
FIG. 8 is another cross sectional view showing the electronic device according to the present invention.
Figure 9:
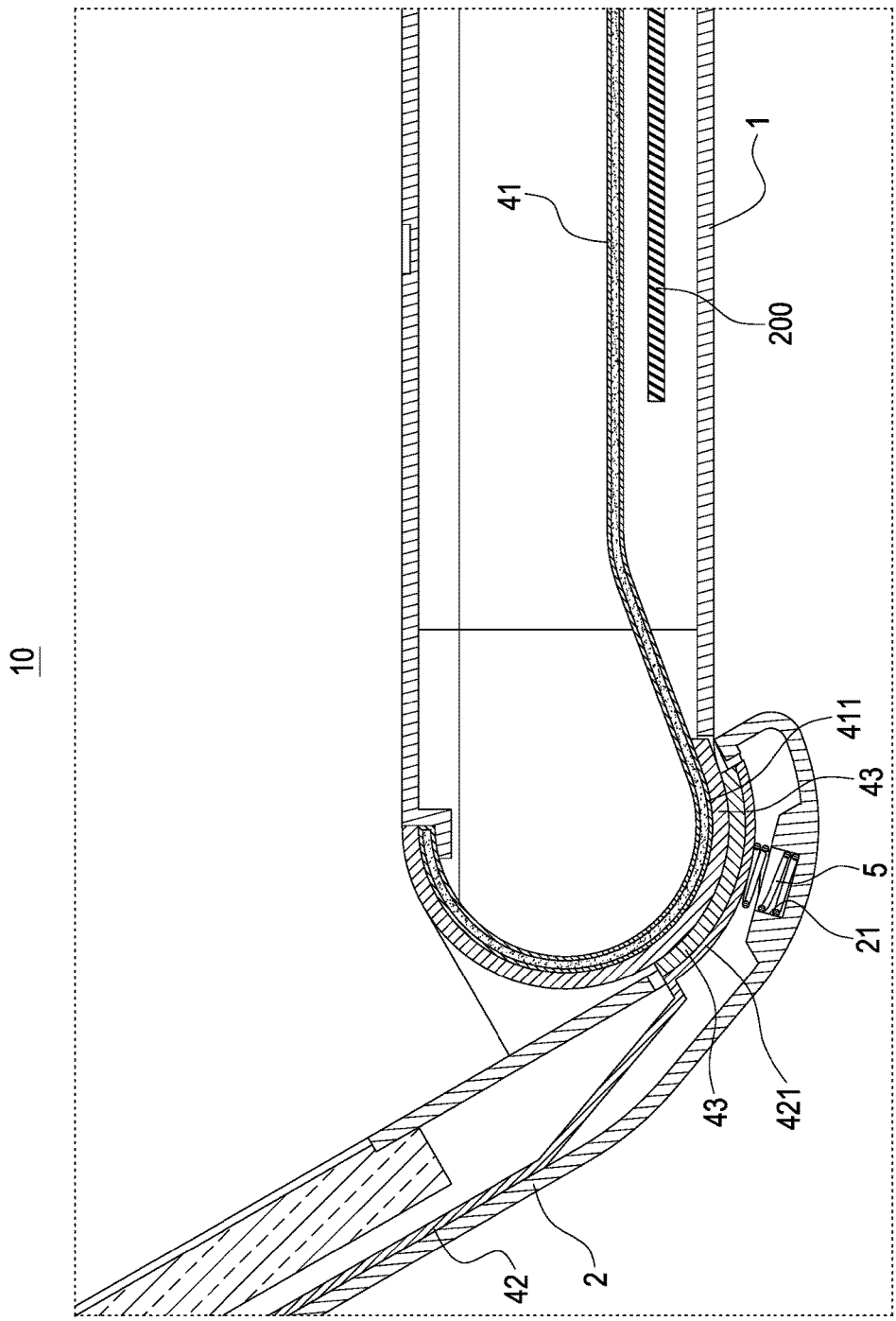
FIG. 9 is another partially enlarged view showing the electronic device according to the present invention.

Please refer from FIG. 1 to FIG. 9, an electronic device and a heat dissipation structure thereof are provided by the present invention. The electronic device 10 mainly comprises a first shell body 1, a second shell body 2 and a heat dissipation structure 4. The heat dissipation structure 4 mainly includes a first heat conducting member 41 and a second heat conducting member 42.

As shown from FIG. 4 to FIG. 9, the first shell body 1 and the second shell body 2 are mutually pivoted by utilizing a hinge structure (not shown in figures), so that the first shell body 1 and the second shell body 2 can be relatively folded or unfolded. Wherein, a positioning slot 21 is formed in the second shell body 2.

Moreover, according to this embodiment, the first shell body 1 is a base of a notebook computer, the second shell body 2 is a screen of the notebook computer, a circuit board 200 having a heating unit 100 is disposed inside the first shell body 1, but what shall be addressed is that the scope of the present invention is not limited to the above-mentioned arrangement, the first shell body 1 and the second shell body 2 disclosed in the present invention can be the base and the screen of any electronic device, and the circuit board 200 having the heating unit 100 can be optionally disposed inside the first shell body 1 or the second shell body 2.

As shown from FIG. 1 to FIG. 9, that heat dissipation structure 4 includes the above-mentioned first heat conducting member 41 and the above-mentioned second heat conducting member 42. The first heat conducting member 41 is disposed in the first shell body 1 and extended with a first arc-shaped piece 411. The second heat conducting member 42 is disposed in the second shell body 2 and extended with a second arc-shaped piece 421. The first arc-shaped piece 411 and the second arc-shaped piece 421 are both disposed in the second shell body 2, and the second arc-shaped piece 421 is arranged to be continuously and thermally in contact with the first arc-shaped piece 411 and capable of sliding and rotating relative to the first arc-shaped piece 411.

Moreover, according to this embodiment, the heating unit 100 is disposed in the first shell body 1, and the heating unit 100 is arranged to be thermally in contact with the first heat conducting member 41; on the other hand, when the heating unit 100 is disposed in the second shell body 2, the heating unit 100 is arranged to be thermally in contact with the second heat conducting member 42. Wherein, according to this embodiment, the first heat conducting member 41 is a heat spreader and the second heat conducting member 42 is a metal heat conducting plate, but what shall be addressed is that the scope of the present invention is not limited to the above-mentioned arrangement, the first heat conducting member 41 and the second heat conducting member 42 can be any of a metal heat conducting plate, a heat spreader or a heat pipe.

Details are provided as follows. The heat dissipation structure 4 further includes two heat conducting flexible pieces 43, the heat conducting flexible piece 43 is provided with properties of high thermal conductivity and flexibility, and the two heat conducting flexible pieces 43 are disposed between the first arc-shaped piece 411 and the second arc-shaped piece 421, one of the heat conducting flexible pieces 43 is arranged to be in contact with an outer surface 412 of the first arc-shaped piece 411 and capable of being displaced with the first arc-shaped piece 411, the other heat conducting flexible piece 43 is arranged to be in contact with an inner surface 422 of the second arc-shaped piece 421 and capable of being displaced with the second arc-shaped piece 421. Wherein, the heat conducting flexible piece 43 is a graphite piece, but what shall be addressed is that scope of the present invention is not limited to the above-mentioned arrangement.

According to the present invention, the electronic device 10 further comprises an elastic member 5 which is positioned in the positioning slot 21 of the second shell body 2 and clamped between the second arc-shaped piece 421 and the second shell body 2, and the elastic member 5 is used for pressing the second arc-shaped piece 421 to be leaned against the first arc-shaped piece 411. Wherein, the elastic member 5 can be a spiral spring, an elastic sheet, a leaf spring, a torsion spring or a disc spring.

As shown from FIG. 4 to FIG. 9, which illustrate the operating statuses of the electronic device 10 and the heat dissipation structure 4 provided by the present invention. When the heating unit 100 is arranged to be thermally in contact with the first heat conducting member 41, thermal energy is transferred to the second heat conducting member 42 via the first arc-shaped piece 411 and the second arc-shaped piece 421, so that the thermal energy is transferred from the first shell body 1 having the heating unit 100 to the second shell body 2; on the other hand, when the heating unit 100 is arranged to be thermally in contact with the second heat conducting member 42, the thermal energy is transferred to the first heat conducting member 41 via the first arc-shaped piece 411 and the second arc-shaped piece 421, so that the thermal energy is transferred from the second shell body 2 having the heating unit 100 to the first shell body 1. Accordingly, the thermal energy can be transferred from the shell body having the heat unit 100 to the other shell body, thereby increasing the heat dissipation efficiency of the electronic device 10.

Moreover, the heat dissipation structure 4 further includes the two above-mentioned heat conducting flexible pieces 43, one of the heat conducting flexible pieces 43 is arranged to be in contact with the outer surface 412 of the first arc-shaped piece 411 and capable of being displaced with the first arc-shaped piece 411, the other heat conducting flexible piece 43 is arranged to be in contact with the inner surface 422 of the second arc-shaped piece 421 and capable of being displaced with the second arc-shaped piece 421; during the process of the first shell body 1 and the second shell body 2 being relatively folded or unfolded, a friction force generated while the first arc-shaped piece 411 and the second arc-shaped piece 421 being relatively sliding can be damped by the heat conducting flexible pieces 43, so that the friction between the first arc-shaped piece 411 and the second arc-shaped piece 421 can be prevented, and damages and noises generated due to the friction can be avoided.

Moreover, the electronic device 10 further comprises the above-mentioned elastic member 5, because during the process of the first shell body 1 and the second shell body 2 being mutually folded or unfolded, the contacting status of the first arc-shaped piece 411 and the second arc-shaped piece 421 may be loosened, the elastic member 5 is clamped between the second arc-shaped piece 421 and the second shell body 2, so that the elastic member 5 is able to press the second arc-shaped piece 421 to be leaned against the first arc-shaped piece 411. Accordingly, during the process of the first shell body 1 and the second shell body 2 being mutually folded or unfolded, the first arc-shaped piece 411, the second arc-shaped piece 421 and the two heat conducting flexible pieces 43 can be remained in a mutually-contacting status, so that the heat conduction between the first arc-shaped piece 411, the second arc-shaped piece 421 and the heat conducting flexible pieces 43 can be further enhanced.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. An electronic device, comprising: a first shell body (1); a second shell body (2), mutually pivoted with the first shell body (1); and a heat dissipation structure (4), including a first heat conducting member (41) and a second heat conducting member (42), wherein the first heat conducting member (41) is disposed in the first shell body (1) and extended with a first arc-shaped piece (411), the second heat conducting member (42) is disposed in the second shell body (2) and extended with a second arc-shaped piece (421), and the second arc-shaped piece (421) is arranged to be thermally in contact with the first arc-shaped piece (411) and capable of sliding and rotating relative to the first arc-shaped piece (411), wherein the heat dissipation structure (4) further includes two heat conducting flexible pieces (43) disposed between the first arc-shaped piece (411) and the second arc-shaped piece (421), wherein one of the two heat conducting flexible pieces (43) is arranged to be in contact with an outer surface (412) of the first arc-shaped piece (411) and capable of being displaced with the first arc-shaped piece (411), and the other heat conducting flexible piece (43) is arranged to be in contact with an inner surface (422) of the second arc-shaped piece (421) and capable of being displaced with the second arc-shaped piece (421).

2. The electronic device according to claim 1, wherein each of the two heat conducting flexible pieces (43) is a graphite piece.

3. An electronic device, comprising:
a first shell body (1);
a second shell body (2), mutually pivoted with the first shell body (1);
a heat dissipation structure (4), including a first heat conducting member (41) and a second heat conducting member (42), wherein the first heat conducting member (41) is disposed in the first shell body (1) and extended with a first arc-shaped piece (411), the second heat conducting member (42) is disposed in the second shell body (2) and extended with a second arc-shaped piece (421), and the second arc-shaped piece (421) is arranged to be thermally in contact with the first arc-shaped piece (411) and capable of sliding and rotating relative to the first arc-shaped piece (411); and
an elastic member (5), wherein the first arc-shaped piece (411) and the second arc-shaped piece (421) are both disposed in the second shell body (2), and the elastic member (5) is clamped between the second arc-shaped piece (421) and the second shell body (2).

4. The electronic device according to claim 3, wherein a positioning slot (21) is formed in the second shell body (2), and the elastic member (5) is positioned in the positioning slot (21).

5. The electronic device according to claim 3, wherein the elastic member (5) is a spiral spring.

6. An electronic device, comprising:
a first shell body (1);
a second shell body (2), mutually pivoted with the first shell body (1); and
a heat dissipation structure (4), including a first heat conducting member (41) and a second heat conducting member (42), wherein the first heat conducting member (41) is disposed in the first shell body (1) and extended with a first arc-shaped piece (411), the second heat conducting member (42) is disposed in the second shell body (2) and extended with a second arc-shaped piece (421), and the second arc-shaped piece (421) is arranged to be thermally in contact with the first arc-shaped piece (411) and capable of sliding and rotating relative to the first arc-shaped piece (411),
wherein the first heat conducting member (41) is a metal heat conducting plate, a heat spreader or a heat pipe, and the second heat conducting member (42) is a metal heat conducting plate, a heat spreader or a heat pipe.

7. A heat dissipation structure, including: a first heat conducting member (41), extended with a first arc-shaped piece (411); a second heat conducting member (42), extended with a second arc-shaped piece (421), wherein the second arc-shaped piece (421) is arranged to be thermally in contact with the first arc-shaped piece (411) and capable of sliding and rotating relative to the first arc-shaped piece (411); and two heat conducting flexible pieces (43) disposed between the first arc-shaped piece (411) and the second arc-shaped piece (421), wherein one of the two heat conducting flexible pieces (43) is arranged to be in contact with an outer surface (412) of the first arc-shaped piece (411) and capable of being displaced with the first arc-shaped piece (411), and the other heat conducting flexible piece (43) is arranged to be in contact with an inner surface (422) of the second arc-shaped piece (421) and capable of being displaced with the second arc-shaped piece (421).

8. The heat dissipation structure according to claim 7, wherein each of the two heat conducting flexible pieces (43) is a graphite piece, the first heat conducting member (41) is a metal heat conducting plate, a heat spreader or a heat pipe, and the second heat conducting member (42) is a metal heat conducting plate, a heat spreader or a heat pipe.

* * * * *